(12) United States Patent
Seyfried et al.

(10) Patent No.: US 7,576,316 B2
(45) Date of Patent: Aug. 18, 2009

(54) APPARATUS, MICROSCOPE WITH AN APPARATUS, AND METHOD FOR CALIBRATION OF A PHOTOSENSOR CHIP

(75) Inventors: Volker Seyfried, Nussloch (DE); Frank Schreiber, Dossenheim (DE)

(73) Assignee: Leica Microsystems CMS GmbH, Wetzlar (DE)

( * ) Notice: Subject to any disclaimer, the term of this patent is extended or adjusted under 35 U.S.C. 154(b) by 208 days.

(21) Appl. No.: 11/649,877

(22) Filed: Jan. 5, 2007

(65) Prior Publication Data

US 2007/0200052 A1 Aug. 30, 2007

(30) Foreign Application Priority Data

Jan. 7, 2006 (DE) .................. 10 2006 001 976

(51) Int. Cl.
*G12B 13/00* (2006.01)

(52) U.S. Cl. ................................... 250/252.1

(58) Field of Classification Search ............... 250/252.1
See application file for complete search history.

(56) References Cited

U.S. PATENT DOCUMENTS

| | | | |
|---|---|---|---|
| 5,302,824 A | 4/1994 | Prager | |
| 5,337,340 A | 8/1994 | Hynecek | |
| 5,789,622 A | 8/1998 | Quon et al. | |
| 6,075,613 A * | 6/2000 | Schermer et al. | 356/446 |
| 6,377,300 B1 * | 4/2002 | Morris et al. | 348/207.99 |
| 6,392,794 B1 | 5/2002 | Engelhardt et al. | |
| 6,664,537 B2 | 12/2003 | Engelhardt et al. | |
| 6,784,412 B2 | 8/2004 | Hynecek | |
| 2003/0025067 A1 | 2/2003 | Tsai et al. | |
| 2003/0223531 A1 | 12/2003 | Kashima et al. | |
| 2004/0095624 A1 | 5/2004 | Knebel et al. | |

FOREIGN PATENT DOCUMENTS

| | | |
|---|---|---|
| DE | 690 32 582 T2 | 5/1999 |
| DE | 199 44 148 A1 | 3/2001 |
| DE | 692 31 482 T2 | 5/2001 |
| DE | 100 38 526 B4 | 2/2002 |
| DE | 100 38 622 A1 | 2/2002 |
| DE | 102 28 477 A1 | 1/2004 |
| DE | 102 53 609 A1 | 5/2004 |

(Continued)

OTHER PUBLICATIONS

Colin G. Coates et al., Black-Illuminated Electron Multiplying Technology: The World's Most Sensitive CCD for Ultra Low-Light Microscopy.

(Continued)

*Primary Examiner*—David P Porta
*Assistant Examiner*—Marcus H Taningco
(74) *Attorney, Agent, or Firm*—Foley & Lardner LLP

(57) ABSTRACT

An apparatus, a microscope having an apparatus, and a method for calibration of a photosensor chip (19) are disclosed. The apparatus has a photosensor chip (19) which has a multiplicity of light-sensitive elements. A reference light source (30) is provided and directs the light at at least one part of the photosensor chip (19). In addition, an open-loop or closed-loop control unit (19*a*) is provided and determines and corrects variances between the individual light-sensitive elements.

60 Claims, 4 Drawing Sheets

FOREIGN PATENT DOCUMENTS

| | | |
|---|---|---|
| DE | 10 2004 003 993 A1 | 3/2005 |
| DE | 698 28 099 T2 | 11/2005 |
| EP | 0 562 424 B1 | 5/1997 |
| EP | 1 688 960 A2 | 1/2006 |
| GB | 2 348 070 A | 9/2000 |
| WO | WO 91/18470 A1 | 11/1991 |
| WO | WO 92/09109 A1 | 5/1992 |
| WO | WO 02/058157 A2 | 7/2002 |

OTHER PUBLICATIONS

Kim R. Fowler, Automatic Gain Control for Image—Intensified Camera, IEEE Transactions on Instrumentation and Measurement, vol. 53, No. 4, Aug. 2004.

* cited by examiner

APPARATUS, MICROSCOPE WITH AN APPARATUS, AND METHOD FOR CALIBRATION OF A PHOTOSENSOR CHIP

CROSS-REFERENCE TO RELATED PATENT APPLICATIONS

The right of foreign priority is claimed under 35 U.S.C. §119(a) based on Federal Republic of Germany Application No. 10 2006 000 976.2, filed Jan. 7, 2006, the entire contents of which, including the specification, drawings, claims and abstract, are incorporated herein by reference.

BACKGROUND OF THE INVENTION

The invention relates to an apparatus for calibration of a photosensor chip. The photosensor chip is equipped with a multiplicity of light-sensitive elements.

The invention also relates to a microscope having an apparatus for calibration of a photosensor chip. In this case, the microscope has at least one light source which emits an illumination light beam which illuminates a sample point-by-point, in the form of a point grid or line-by-line through the optics and via a scanning device, and having a dispersive element which spatially spectrally splits a detection light beam which originates from the sample, and directs it at a light-sensitive area on a photosensor chip.

The invention also relates to a method for calibration of a photosensor chip

German Patent Application DE 102 53 609 discloses a scanning microscope which has a detector, which is arranged in a detection beam path, for reception of detection light originating from a sample. An optical shutter means is arranged between the sample and the detector, and can be used to block the detection beam path. A control means is provided for open-loop control of the shutter means. The detection beam path can be blocked automatically outside the scanning process and when the detection light power is excessively high.

US Patent Application 2003/0223531 discloses the signal gain of a charge multiplication detector or of a CMD (Charge Multiplying Device) being checked with high precision. The CMD has a multiplicity of sections, each of which in turn represents one CMD, so that charge multiplication can be carried out in this way.

German Patent Specification DE 100 38 526 discloses a method and an arrangement for fluorescence microscopy, in particular for laser scanning microscopy, fluorescence correlation spectroscopy and scanning near-field microscopy, in order to investigate primarily biological samples, preparations and associated components. The changeover from the detection of a small number of broad spectral color fluorescence bands to the simultaneous recording of complete spectra opens up new capabilities for identification, separation and association of the generally analytical or functional sample characteristics with respect to three-dimensional structure elements or dynamic processes. Simultaneous investigations of samples with multiple fluorophores are thus possible with overlapping fluorescence spectra, even in three-dimensional structures with thick samples. The data recording rate is not reduced by the arrangement.

The German translation DE 690 32 582 T2 of a European Patent discloses a silicon avalanche photodiode matrix, which comprises a body composed of n-type silicon semiconductor material, which has phosphorous distributed uniformly in it by means of neutron conversion doping. The resistivity has a maximum discrepancy of 0.5% over at least one active area. The body has a first and second opposite surface, which enclose a radiation input surface, and which are separated from one another by a side surface. Furthermore, a p-n junction is provided and extends between the surfaces, with the side surface being inclined in order to maximize the breakdown voltage. A multiplicity of signal contacts which are arranged on the first body surface form the individual photodiodes. Furthermore, a common electrode is provided, and is arranged on the second body surface. A means for reading signals from the signal contacts is likewise provided.

The German translation DE 692 31 482 T2 of a European Patent discloses a CCD image sensor with small pixels. So far, the increasing demand in this field from the consumer market for CCD cameras with ever higher resolution requires that the developers increase the number of pixels of the CCD image sensors that are used in these products. At the same time, the competitive pressure requires not only for the price of these sensors to be maintained or to be reduced, but also for the chip size to be reduced, in consequence resulting in a reduction in the size of the active pixel area. However, this leads to two major problems: the reduction in the sensitivity of the image sensor, and the reduction in the signal-to-noise ratio. The sensitivity of the image sensors is proportional to the pixel area, to the aperture efficiency, to the quantum efficiency, to the integration type and to the charge/voltage conversion factor. The maximum sensor sensitivity of present-day image sensors is normally governed by the noise level of the charge detection amplifiers which convert the charge that has been collected to an output voltage. Without this restriction, it will be possible to detect the individual photons, and in consequence to achieve a photon counting mode, the maximum capability of an image sensor, which is governed by the fundamental laws of physics.

British Patent GB 2 348 070 discloses a photocathode CCD sensor having a separate high-field multiplication register. The imaging device is suitable for counting photons, or for applications in low lighting conditions. The apparatus comprises a CCD sensor, which is arranged in such a manner that it receives the electrons which are emitted from a photocathode. The CCD component has a separate high-field multiplication register, to which signals are transferred from an output register. The aim of this is to achieve a better signal-to-noise ratio, and better resolution.

German Patent Application DE 10 2004 003 993 discloses an apparatus for verification of the photons in a light beam which originates from a physically limited source, in particular for use in a fluorescence microscope. For this purpose, a detection device is provided in order to increase the maximum counting rate which can be processed by the detection device. The detection device comprises at least two detectors. A component is provided in the beam path of the light beam, by means of which the light beam is split in such a manner that the photons are distributed over the detectors, for verification purposes.

In the case of EMCCD chips, electrons that are generated by light in the photo-active area are amplified again in an amplifier register before they are read. The gain of this amplification register depends on various parameters, such as the voltage, temperature, time etc., in a complex manner. The data obtained about the illumination intensity of the EMCCD chips is correspondingly difficult to assess. Problems occur even if the EMCCD chip has a single amplification register (as is the normal case), and a plurality of measurements carried out successively are intended to be compared with one another. Particularly serious problems occur in particular when the EMCCD chip has a plurality of amplification registers, which may behave differently for various reasons.

SUMMARY OF THE INVENTION

The invention is based on the object of providing an apparatus for calibration of a photosensor chip, by means of which the gain response of an amplification register can be kept constant over time by adjustment and/or closed-loop control of suitable parameters, or the gain response of a plurality of amplification registers can be matched to one another. A further aim is to correct relevant defects caused by the gain response of the amplification register by subsequent processing of the recorded data, as well.

The object is achieved by an apparatus which has the features of claim 1.

A further object of the invention is to provide a microscope which has an apparatus for calibration of a photosensor chip, in order that the gain response of an amplification register is kept constant over time by adjustment or closed-loop control of suitable parameters. It is likewise intended to be possible to correct for the effects, which are dependent on the amplification registers, caused by the gain response, by subsequent processing of the recorded data.

The object is achieved by a microscope which has the features of claim 23.

In addition, another object of the invention is to provide a method by means of which the gain response of an amplification register can be kept constant over time by adjustment of suitable parameters, or the gain response of a plurality of amplification registers can be matched to one another. It is likewise intended to be possible to correct for the relative effects that are caused by the gain response of the amplification register by subsequent processing of the recorded data.

The object is achieved by a method which has the features of Patent claim 44. For calibration purposes, it is advantageous to provide a reference light source which directs light at at least one part of the photosensor chip. Furthermore, an open-loop or closed-loop control unit is provided, and determines and corrects variances between the individual light-sensitive elements.

The reference light source illuminates all of the light-sensitive elements on the photosensor chip. It is likewise feasible for the reference light source to illuminate a limited number of the light-sensitive elements on the photosensor chip. The limited number of light-sensitive elements on the photosensor chip are those light-sensitive elements which make no contribution to the actual measurement.

The reference light source defines a reference beam path, and a detection beam is likewise directed at the photosensor chip, with the detection beam path and the reference beam path being partially identical.

It is likewise feasible for the detection beam path and the reference beam path to be physically separated from one another. In addition, a filter wheel may be provided in the reference beam path. It is likewise feasible to provide a mask in the reference beam path in order to illuminate selected light-sensitive elements on the photosensor chip. The selected illumination of light-sensitive elements on the photosensor chip can likewise be achieved by an array of microelectronic mirrors (MEMS).

The reference light source may be in the form of a point light source. It is likewise feasible for the reference light source to be followed by a perforated shutter in order in this way to produce a point light source. The perforated shutter may be in the form of a fixed shutter or a variable shutter.

The reference light source can be switched on and off in such a manner that either only light from the detection beam path or only light from the reference beam path strikes the photosensor chip. The reference light source can be switched on and off via the open-loop or closed-loop control unit. A switchable filter can be provided, and can be used to adjust the light intensity of the reference light via the open-loop or closed-loop control unit. The switchable filter is an acousto-optical element, an electro-optical element or a liquid-crystal display.

The open-loop or closed-loop control unit corrects the different gains of the light-sensitive elements on the photosensor chip. This correction is carried out by amplification of the signal by the light-sensitive elements on the photosensor chip.

It is likewise feasible for the open-loop or closed-loop control unit to correct the different gains of the light-sensitive elements on the photosensor chip by individual closed-loop control of the gain of the signal from the light-sensitive elements on the photosensor chip.

A microscope is provided, having at least one light source which emits an illumination light beam which illuminates a sample point-by-point, in the form of a point grid or line-by-line through the optics and via a scanning device. A dispersive element is provided, which spatially splits a detection light beam which originates from the sample, and directs it at a light-sensitive area on a photosensor chip. In addition, a reference light source is provided in the microscope and directs light at at least one part of the photosensor chip. An open-loop or closed-loop control unit is likewise provided, and determines and corrects variances between the individual light-sensitive elements.

A method for calibration of a photosensor chip which has a multiplicity of light-sensitive elements is also advantageous. A reference light source emits a reference light beam. The reference light beam is directed at at least one part of the photosensor chip. Furthermore, an open-loop or closed-loop control unit is provided, and is used to determine and correct variances between the individual light-sensitive elements.

Further advantageous refinements of the invention can be found in the dependent claims.

Further objects, features and advantages of the present invention will become apparent from the detailed description of preferred embodiments that follows, when considered together with the accompanying figures of drawing.

BRIEF DESCRIPTION OF THE DRAWINGS

The subject matter of the invention is illustrated schematically in the drawing, and will be described in the following text with reference to the figures, in which.

DETAILED DESCRIPTION OF THE PREFERRED EMBODIMENTS

Figure 1:
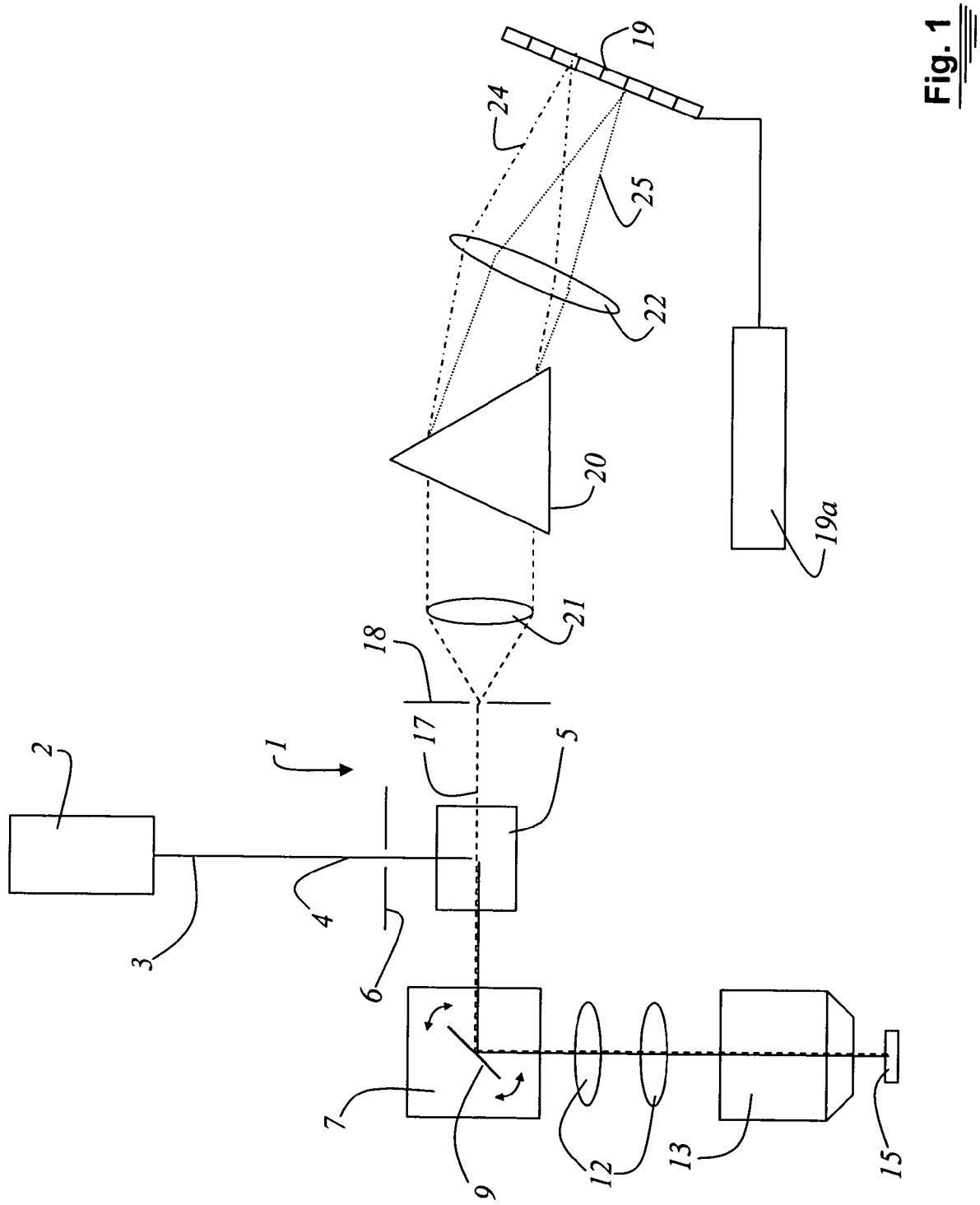
FIG. 1 shows a schematic illustration of a scanning microscope having a photosensor chip for recording of the signals of the detection light.

FIG. 1 shows the schematic design of a laser scanning microscope 1. The illumination light beam 3 coming from at least one illumination system 2 is passed from a beam splitter or a suitable deflection means 5 to a scanning device 7. Before the illumination light beam 3 strikes the deflection means 5, it passes through an illumination pinhole 6. The scanning device 7 has at least one scanning mirror 9, which passes the illumination light beam 3 through scanning optics 12 and microscope optics 13 over or through an object 15 the illumination light beam 3 is passed over the object surface, if the objects 15 are not transparent. In the case of biological objects 15 (preparations) or transparent objects, the illumination light beam 3 can also be passed through the object 15. For this purpose, non-fluorescent preparations are marked, if required, with a suitable dye (not shown, since this is established prior art). The dyes in the object 15 are excited by the illumination light beam 3, and emit light in their own characteristic range of the spectrum. This light which originates from the object 15 defines a detection light beam 17, which is passed through the microscope optics 13, the scanning optics 12 and via the scanning device 7 to the deflection means 5, through which it passes before passing through a detection pinhole 18 to at least one photosensor chip 19, which is in the form of a CCD chip, EMCCD chip, APD array or PMT array. The detection light beam 17 originating from or defined by the object is illustrated as a dashed line in FIG. 1. Electrical detection signals, which are largely proportional to the power of the light originating from the object 15, are produced in the photosensor chip 19. Since, as already mentioned above, light is emitted from the object 15 not just at one wavelength, it is worthwhile arranging a dispersive element 20 upstream of the photosensor chip 19. The dispersive element 20 splits the detection light beam spectrally, so that the individual wavelengths in the detection light are spatially spectrally separated. The dispersive element 20 is preceded by a lens 21, which converts the detection light beam 17 to a parallel form. The dispersive element 20 is followed by a further lens 22, which focuses the spectrally separated beams 24, 25 of the detection light beam 17 onto the photosensor chip 19. The spectrally separated beams 24, 25 are at different wavelengths, and thus strike different areas on the photosensor chip 19.

In order to achieve an optimum EMCCD chip response, the gain of the register must be matched to the illumination intensity and the illumination duration on the EMCCD chip. The amplification voltage at the various registers in the photosensor chip 19 can be varied for this purpose. The amplification of the charges on passing through the amplifier path is, however, dependent not only on the amplified voltage, but also on the temperature. Furthermore, for example, manufacturing tolerances result in variations in the gain in the various amplifier registers. Particular difficulties result from the fact that the temperature dependency of the gain is different in different amplifiers. The amplification registers on the photosensor chip 19 may behave differently, and the reasons for this may be as follows: with the same basic setting, the different amplification registers may have a different gain because of manufacturing tolerances, and the amplification voltage may likewise fluctuate from one amplification register to another. A further influence may be a fluctuation in the temperature along the photosensor chip. Changes in the local temperature on the photosensor chip (temperature gradient over the photosensor chip) likewise lead to different gain. Ageing effects in the photosensor chip can likewise influence the gain of the individual amplification registers, and changes in the other environmental conditions likewise have a negative effect on homogenous amplification by the individual amplification registers. The fluctuations and dependencies to be expected are considerably greater than, for example, in the case of photomultipliers. A quantitative comparison between the output signals from two different registers, or from one and the same register for two successive measurements at, for example, different temperatures, is very difficult. Problems occur in particular if one EMCCD chip is equipped with a plurality of amplification registers, and the application demands that the gain of all of the signals be identical. Similar problems, as mentioned above, also occur in the case of APD arrays or photomultiplier arrays. All of these negative influences are detected by means of the open-loop or closed-loop control unit 19a, and the various gains of the amplification registers are matched.

Figure 2:
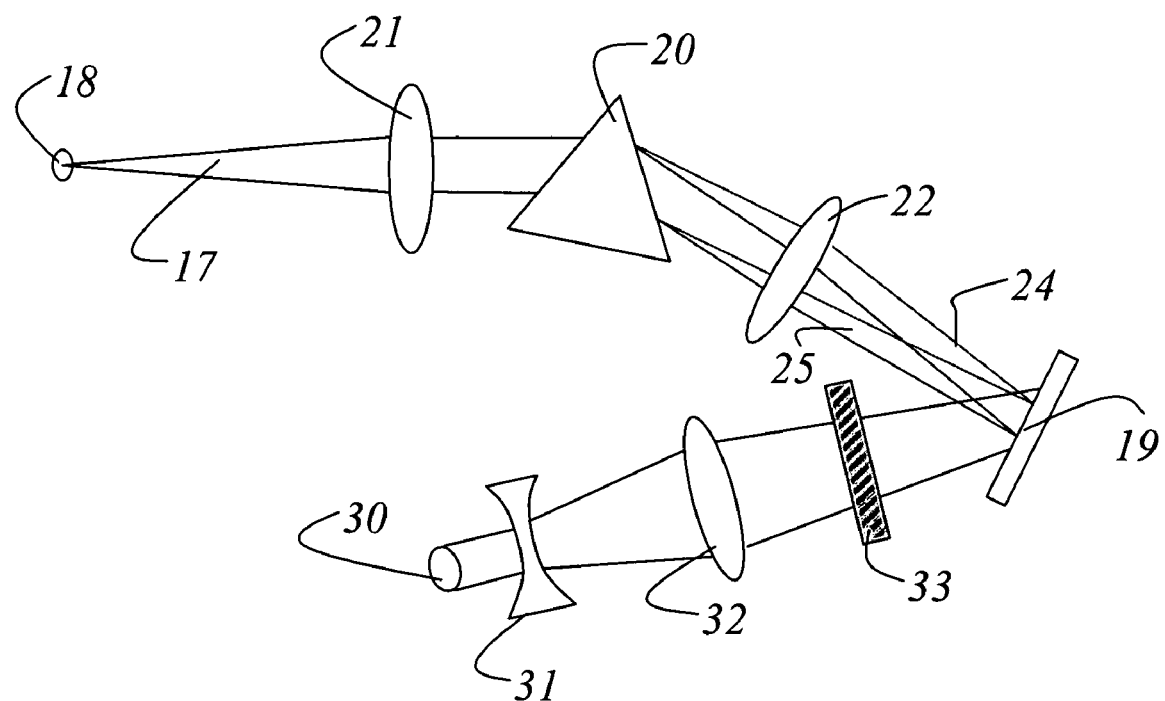
FIG. 2 shows a schematic illustration of the beam path downstream from the detection light shutter, with the light intensity of the reference light being adjusted by means of a filter wheel.

FIG. 2 shows an embodiment of the beam path in a laser scanning microscope downstream from the detection perforated shutter 18. As already mentioned above, the detection light from the detection perforated shutter 18 is imaged by an optical element 21 on a dispersive element 20. In this case, the dispersive element 20 is a prism. The dispersive element 20 spectrally splits the detection light. The detection light is imaged by a further optical element 22 on a photosensor chip 19, with the different spectral components of the detection light being imaged on different areas of the photosensor chip 19. For example, the photosensor chip 19 may be an EMCCD chip, an APD array or a PMT array. The dispersive element 20 may be a prism, a grating, a holographic element, etc. As already mentioned, the optical element 22 spatially splits the various spectral components of the detection light, so that they strike the photosensor chip 19 at different points. The spectrum of the illumination light is then obtained directly by reading the photosensor chip 19. However, the light intensity in specific, selected spectral bands can also be determined by suitable evaluation of the data obtained. However, this gives sufficiently good results only when there is no change in the gain of the photosensor chip 19 over time. A further condition is that different pixels or elements of the photosensor chip 19 behave in the same way or in a similar way. In order to determine the unknown gain of an individual amplification register, or of a plurality of different amplification registers, in the photosensor chip 19, and to the match them, it is sufficient to carry out a reference measurement with known illumination intensity. For this purpose, a plurality of pixels or elements of the photosensor chip 19 which are associated with different amplification registers must have the same illumination intensity applied to them, preferably at the same time. A different illumination intensity is also possible if the differences are either known or do not vary over time. In the embodiment illustrated in FIG. 2, a reference light source 30 is provided for application of light to the pixels or elements of the photosensor chip 19. The reference light source 30 may be provided, for example, by means of an LED, a laser diode, an incandescent bulb, a discharge lamp, etc. In particular, a reference light source 30 which can be switched rapidly, such as an LED or a laser diode, is advantageous, since this allows the illumination for calibration to be restricted to the small number of times that are relevant for calibration. The reference light source 30 is followed by an optical element 31, 32, which images the reference light 40 on the photo sensor chips 19. A switchable filter 33 is provided between the photosensor chip 19 and the optical system 31, 32, and can be used to adjust the light intensity of the reference light 40. By way of example, the switchable filter 33 may be an acousto-optical element, and/or an electro-optical element or an LCD, etc. In the embodiment illustrated in FIG. 2, the detection light beam 17 and the reference light beam are physically separated from one another. By way of example, the photosensor chip 19 may be illuminated for the reference measurement either before or after the actual measurement. It is likewise feasible for the reference measurement to be carried out during the return, or at the reversal points of the scanner or of a scanning mirror 9. If the reference measurement is carried out before or after the actual measurement, it is thus possible to also illuminate larger areas of the photosensor chip 19. In this case, it is also possible to illuminate areas which are required for the detection light during the actual measurement. As already mentioned above, it must be possible to switch the light from the reference light source 30 on and off for the reference measurement. It is likewise feasible for the reference measurement also to be carried out during the actual measurement. In this case, in consequence, only areas of the photosensor chip 19 which are not required for the actual measurement are then illuminated. In this case, care should be taken to ensure that areas associated with each amplification register are illuminated for the reference measurement for each amplification register.

Figure 3:
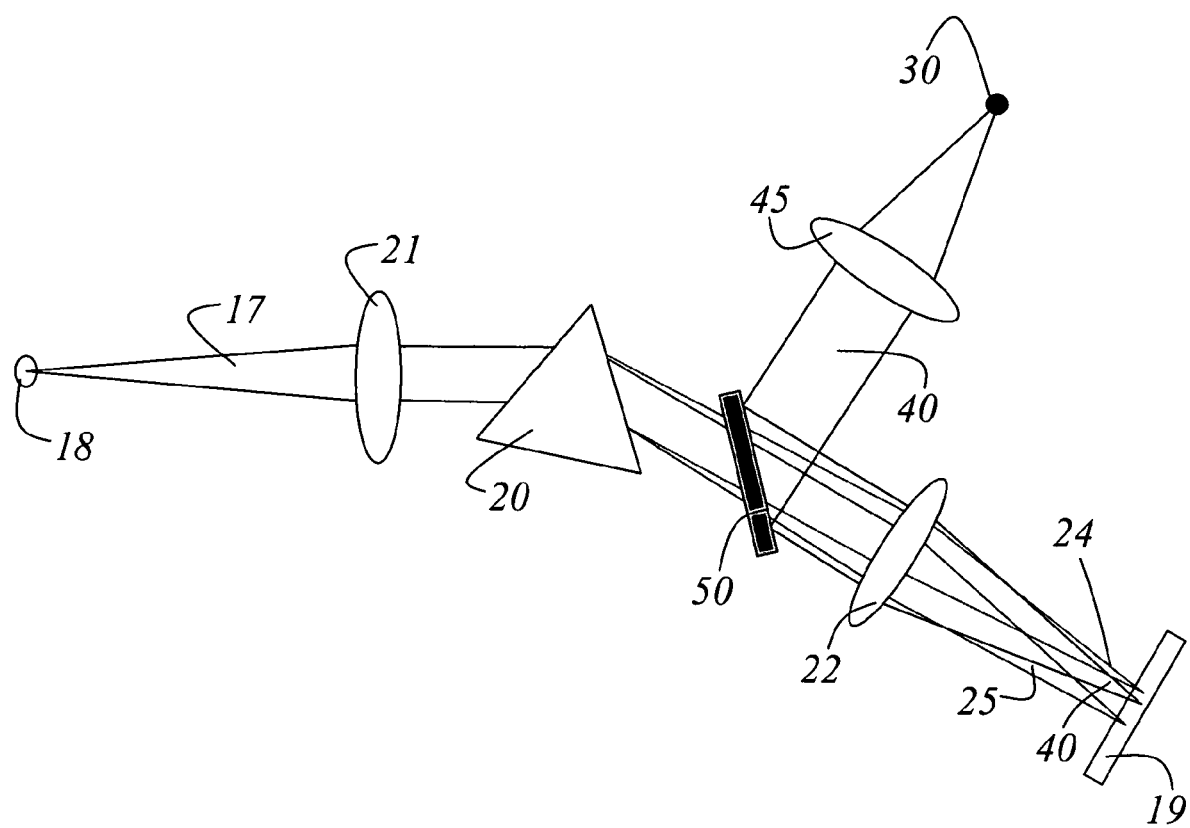
FIG. 3 shows a schematic illustration of the beam path downstream from the detection light shutter, with the detection beam path and the reference beam path running partially identically.

FIG. 3 shows a further embodiment of the present invention, in which the detection beam path 17 and the reference beam path 40 are partially identical. The dispersive element 20 is followed by an input element 50, by means of which the reference beam path 40 is input into the detection beam path 17. In this case, the reference beam path 40 and the beam paths 24 and 25 which have been spectrally split by the dispersive element then strike different areas of the photosensitive element 19. The reference light beam originating from the reference light source is converted to a parallel form by a lens 45. Alternatively, the lens 45 may be a cylindrical lens. With the arrangement proposed in FIG. 3, a limited number of pixels are illuminated on the photosensor chip 19. Pixels which are not required for the actual measurement are preferred for illumination with the reference light beam.

Figure 4:
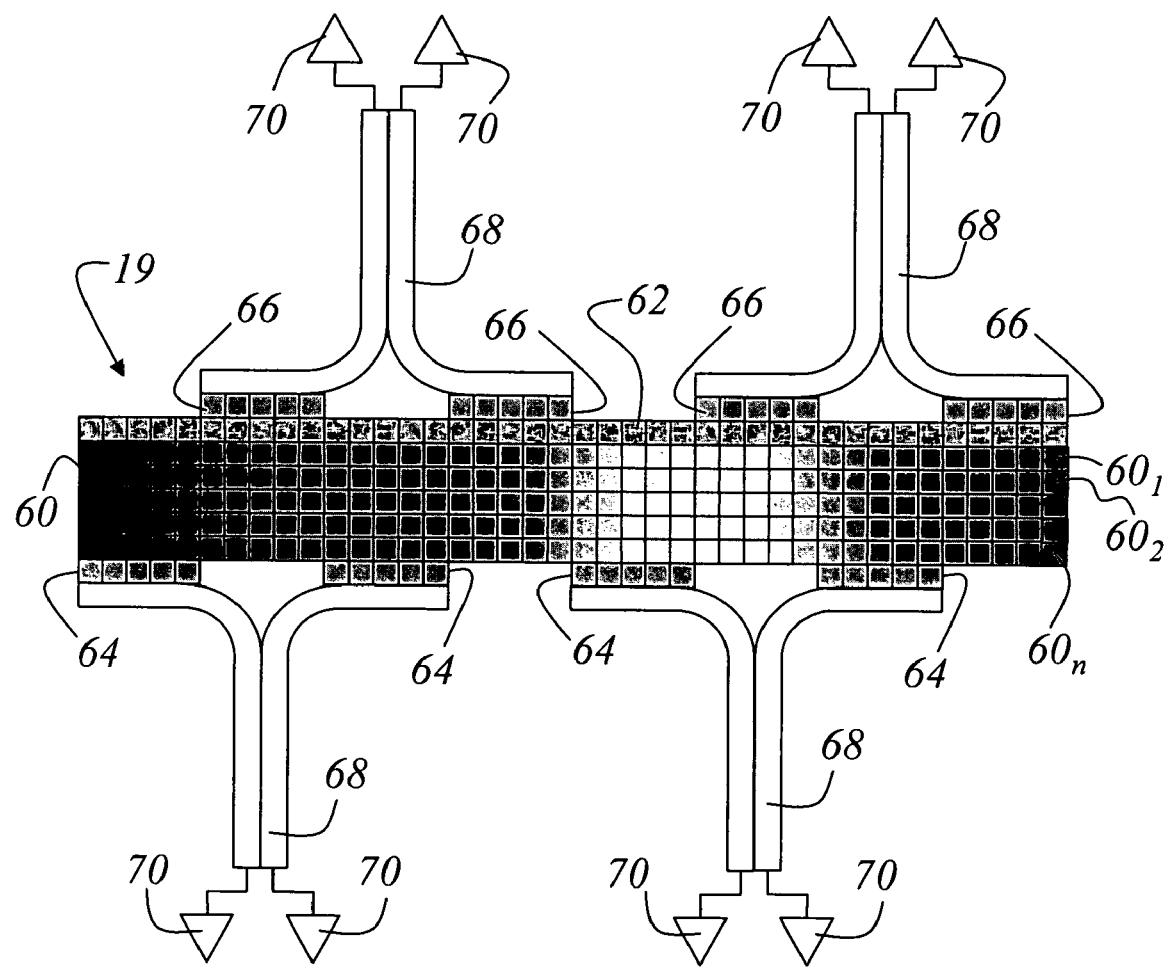
FIG. 4 shows a schematic illustration of a detector array, as is used in a photosensor chip according to the present invention.

FIG. 4 shows a schematic view of the photosensor chip 19. The photosensor chip 19 has an optically sensitive surface 60, which is composed of a plurality of lines 601, 602, ..., 60n. In the embodiment illustrated here, at least one line 62 which can be used for the reference measurement is adjacent to the optically sensitive surface 60. A plurality of addition elements 64 are connected to the optically sensitive surface 60. A plurality of addition elements 66 are likewise connected to the line for the reference measurement 62. The content of the addition elements 64 is supplied to appropriate amplifier registers 68. The contents of the addition elements 66 are likewise supplied to a plurality of amplification registers 68. The output of each of the amplification registers 68 is passed to the appropriate output amplifiers 70. As already mentioned, there are two alternative methods for the reference measurement.

In the first method, the reference measurement is carried out before or after the actual measurement. In this case, larger areas of the photosensor chip can also be illuminated. For example, this may even be the entire optically sensitive surface 60 of the photosensor chip 19. In consequence, the light from the light source can be switched on and off appropriately for this measurement. The data from the reference measurement is supplied to the appropriate amplification registers 68 via the appropriate addition elements 64 and 66.

In a second possible method, the reference measurement is carried out during the actual measurement. In this case, of course, only areas of the optically sensitive surface 60 of the photosensor chip which are not required for the actual measurement are illuminated. In this case, for example, a line 62 is illuminated for the reference measurement. In this case, care must be taken to ensure that the areas of the photosensor chip 19 which must be illuminated are those which are associated with those amplification registers for which the reference measurement is intended to be carried out.

The foregoing description of preferred embodiments of the invention has been presented for purposes of illustration and description only. It is not intended to be exhaustive or to limit the invention to the precise form disclosed, and modifications and variations are possible and/or would be apparent in light of the above teachings or may be acquired from practice of the invention. The embodiments were chosen and described in order to explain the principles of the invention and its practical application to enable one skilled in the art to utilize the invention in various embodiments and with various modifications as are suited to the particular use contemplated. It is intended that the scope of the invention be defined by the claims appended hereto and that the claims encompass all embodiments of the invention, including the disclosed embodiments and their equivalents.

What is claimed is:

1. An apparatus for calibration of a photosensor chip, comprising a multiplicity of light-sensitive elements, wherein a detection beam is configured to be directed at the photosensor chip and a reference light source is provided and is configured to direct light at at least one part of the photosensor chip and wherein an open-loop or closed-loop control unit is provided and is configured to determine and correct variances between the light-sensitive elements; wherein the reference light source is configured to illuminate a limited number of the light-sensitive elements on the photosensor chip; wherein the limited number of light-sensitive elements on the photosensor chip are those light-sensitive elements which make no contribution to actual measurement.

2. The apparatus according to claim 1, wherein the reference light source is configured to illuminate all of the light-sensitive elements on the photosensor chip.

3. The apparatus according to claim 1, wherein the reference light source defines a reference beam path, and a detection beam is configured to be directed at the photosensor chip, with the detection beam path and the reference beam path being partially identical.

4. The apparatus according to claim 1, wherein the reference light source defines a reference beam path, and a detection beam is configured to be directed at the photosensor chip, with the detection beam path and the reference beam path being physically separated.

5. The apparatus according to claim 4, wherein a filter wheel is provided in the reference beam path.

6. The apparatus according to claim 1, wherein a mask is provided in a reference beam path in order to illuminate selected light-sensitive elements on the photosensor chip.

7. The apparatus according to claim 1, wherein an array composed of microelectronic mirrors is provided in a reference beam path in order to illuminate selected light-sensitive elements on the photosensor chip.

8. The apparatus according to claim 1, wherein the reference light source is a point light source.

9. The apparatus according to claim 1, wherein a perforated shutter is connected downstream from the reference light source, in order to produce a point light source.

10. The apparatus according to claim 9, wherein the perforated shutter is a fixed perforated shutter.

11. The apparatus according to claim 9, wherein the perforated shutter is a variable perforated shutter.

12. The apparatus according to claim 1, wherein the light from the reference light source can be switched on and off in such a manner that either only light from a detection beam path or only light from a reference beam path strikes the photosensor chip.

13. The apparatus according to claim 1, wherein the reference light source can be switched on and off via the open-loop or closed-loop control unit.

14. The apparatus according to claim 13, wherein the reference light source is an LED or laser diode.

15. The apparatus according to claim 1, wherein a switchable filter is provided, by means of which the light intensity of the reference light can be adjusted via the open-loop or closed-loop control unit.

16. The apparatus according to claim 15, wherein the switchable filter is an acousto-optical element, an electro-optical element or a liquid-crystal display.

17. The apparatus according to claim 1, wherein the open-loop or closed-loop control unit corrects different gains of the light-sensitive elements on the photosensor chip after amplification of the signal by the light-sensitive elements on the photosensor chip.

18. The apparatus according to claim 1, wherein the open-loop or closed-loop control unit corrects different gains of the light-sensitive elements on the photosensor chip by individual closed-loop control of the gain of the signal from the light-sensitive elements on the photosensor chip.

19. The apparatus according to claim 1, wherein the photosensor chip is an EMCCD comprising a plurality of amplifier registers, an EMCCD with only one amplifier register, a normal CCD, a CMOS chip, an APD array or a multichannel plate.

20. The apparatus according to claim 19, wherein the photosensor chip that is used is a line array or an area array.

21. A microscope comprising at least one light source which emits an illumination light beam which is configured to illuminate a sample point-by-point, in the form of a point grid or line-by-line through optics and via a scanning device, comprising a dispersive element which spatially spectrally splits a detection light beam which originates from the sample, and is configured to direct it at a light-sensitive area on a photosensor chip, wherein a reference light source is provided and is configured to direct light at at least one part of the photosensor chip and wherein an open-loop or closed-loop control unit is provided, and is configured to determine and correct variances between individual light-sensitive elements.

22. The microscope according to claim 21, wherein the reference light source is configured to illuminate all of the light-sensitive elements on the photosensor chip.

23. The microscope according to claim 21, wherein the reference light source is configured to illuminate a limited number of the light-sensitive elements on the photosensor chip.

24. The microscope according to claim 23, wherein the limited number of light-sensitive elements on the photosensor chip are those light-sensitive elements which make no contribution to actual measurement.

25. The microscope according to claim 21, wherein the reference light source defines a reference beam path, and a detection beam is configured to be directed at the photosensor chip, with the detection beam path and the reference beam path being partially identical.

26. The microscope according to claim 21, wherein the reference light source defines a reference beam path, and a detection beam is configured to be directed at the photosensor chip, with the detection beam path and the reference beam path being physically separated.

27. The microscope according to claim 26, wherein a filter wheel is provided in the reference beam path.

28. The microscope according to claim 21, wherein a mask is provided in a reference beam path in order to illuminate selected light-sensitive elements on the photosensor chip.

29. The microscope according to claim 21, wherein the reference light source is a point light source.

30. The microscope according to claim 21, wherein a perforated shutter is connected downstream from the reference light source, in order to produce a point light source.

31. The microscope according to claim 30, wherein the perforated shutter is a fixed perforated shutter.

32. The microscope according to claim 30, wherein the perforated shutter is a variable perforated shutter.

33. The microscope according to claim 21, wherein the light from the reference light source can be switched on and off in such a manner that either only light from a detection beam path, or only light from a reference beam path, strikes the photosensor chip.

34. The microscope according to claim 21, wherein the light from the reference light source can be switched on and off via the open-loop or closed-loop control unit.

35. The microscope according to claim 34, wherein the reference light source is an LED or laser diode.

36. The microscope according to claim 21, wherein a switchable filter is provided, by means of which the light intensity of the reference light can be adjusted via the open-loop or closed-loop control unit.

37. The microscope according to claim 36, wherein the switchable filter is an acousto-optical element, an electro-optical element or a liquid-crystal display.

38. The microscope according to claim 21, wherein the open-loop or closed-loop control unit corrects different gains of the light-sensitive elements on the photosensor chip after amplification of the signal by the light-sensitive elements on the photosensor chip.

39. The microscope according to claim 21, wherein the open-loop or closed-loop control unit corrects different gains of the light-sensitive elements on the photosensor chip by individual closed-loop control of the gain of the signal from the light-sensitive elements on the photosensor chip.

40. The microscope according to claim 21, wherein the photosensor chip is an EMCCD comprising a plurality of amplifier registers, an EMCCD with only one amplifier register, a normal CCD, a CMOS chip, an APD array or a multichannel plate.

41. The microscope according to claim 40, wherein the photosensor chip that is used is a line array or an area array.

42. A method for calibration of a photosensor chip which has a multiplicity of light-sensitive elements, wherein a detection beam is directed at the photosensor chip and a reference light source emits a reference light beam, with the reference light beam being directed at at least one part of the photosensor chip and an open-loop or closed-loop control unit is provided and determines and corrects variances between the light-sensitive elements; wherein the reference light source illuminates a limited number of the light-sensitive elements on the photosensor chip; and wherein the limited number of light-sensitive elements on the photosensor chip are those light-sensitive elements which make no contribution to actual measurement.

43. The method according to claim 42, wherein the reference light source illuminates all of the light-sensitive elements on the photosensor chip.

44. The method according to claim 42, wherein the reference light source defines a reference beam path, and a detection beam is directed at the photosensor chip, with the detection beam path and the reference beam path being partially identical.

45. The method according to claim 42, wherein the reference light source defines a reference beam path, and a detection beam is directed at the photosensor chip, with the detection beam path and the reference beam path being physically separated.

46. The method according to claim 45, wherein a filter wheel is provided in the reference beam path.

47. The method according to claim 42, wherein a mask is provided in a reference beam path in order to illuminate selected light-sensitive elements on the photosensor chip.

48. The method according to claim 42, wherein an array composed of microelectronic mirrors is provided in a reference beam path in order to illuminate selected light-sensitive elements on the photosensor chip.

49. The method according to claim 42, wherein the reference light source is a point light source.

50. The method according to claim 42, wherein a perforated shutter is connected downstream from the reference light source, in order to produce a point light source.

51. The method according to claim 50, wherein the perforated shutter is a fixed perforated shutter.

52. The method according to claim 50, wherein the perforated shutter is a variable perforated shutter.

53. The method according to claim 42, wherein the light from the reference light source can be switched on and off in such a manner that either only light from a detection beam path, or only light from a reference beam path, strikes the photosensor chip.

54. The method according to claim 42, wherein the light from the reference light source is switched on and off via the open-loop or closed-loop control unit.

55. The method according to claim 54, wherein the reference light source is an LED or laser diode.

56. The method according to claim 42, wherein a switchable filter is provided, by means of which the light intensity of the reference light can be adjusted via the open-loop or closed-loop control unit.

57. The method according to claim 42, wherein the open-loop or closed-loop control unit corrects different gains of the light-sensitive elements on the photosensor chip after amplification of the signal by the light-sensitive elements on the photosensor chip.

58. The method according to claim 42, wherein the open-loop or closed-loop control unit corrects different gains of the light-sensitive elements on the photosensor chip by individual closed-loop control of the gain of the signal from the light-sensitive elements on the photosensor chip.

59. The method according to claim 42, wherein the photosensor chip is an EMCCD comprising a plurality of amplifier registers, an EMCCD with only one amplifier register, a normal CCD, a CMOS chip, an APD array or a multichannel plate.

60. The method according to claim 59, wherein the photosensor chip that is used is a line array or an area array.

\* \* \* \* \*